US00RE42074E

(19) United States
(12) Reissued Patent
Kunisato et al.

(10) Patent Number: US RE42,074 E
(45) Date of Reissued Patent: Jan. 25, 2011

(54) MANUFACTURING METHOD OF LIGHT EMITTING DEVICE

(75) Inventors: Tatsuya Kunisato, Takatsuki (JP); Takashi Kano, Ohtsu (JP); Yasuhiro Ueda, Hirakata (JP); Yasuhiko Matsushita, Osaka (JP); Katsumi Yagi, Suita (JP)

(73) Assignee: Sanyo Electric Co., Ltd., Moriguchi-shi (JP)

(21) Appl. No.: 10/321,516

(22) Filed: Dec. 18, 2002

Related U.S. Patent Documents

Reissue of:
(64) Patent No.: 6,162,656
Issued: Dec. 19, 2000
Appl. No.: 09/427,694
Filed: Oct. 27, 1999

U.S. Applications:
(62) Division of application No. 08/847,471, filed on Apr. 25, 1997, now Pat. No. 5,990,496.

(30) Foreign Application Priority Data

Apr. 26, 1996 (JP) ..... 8-107833
Mar. 10, 1997 (JP) ..... 9-055221

(51) Int. Cl.
*H01L 21/00* (2006.01)

(52) U.S. Cl. ..... 438/46; 438/22; 438/45
(58) Field of Classification Search ..... 438/46, 438/22, 45
See application file for complete search history.

(56) References Cited

U.S. PATENT DOCUMENTS 5,247,533 A 9/1993 Okazaki et al.
5,290,393 A 3/1994 Nakamura ..... 156/613
5,345,463 A 9/1994 Mannoh et al.
5,393,993 A 2/1995 Edmond et al.
5,495,155 A 2/1996 Juzswik et al.
5,563,422 A 10/1996 Nakamura et al.
5,578,839 A 11/1996 Nakamura et al.
5,583,878 A 12/1996 Shimizu et al.
5,592,501 A 1/1997 Edmond et al.
5,656,832 A 8/1997 Ohba et al.
5,770,887 A 6/1998 Tadatomo et al.
5,777,350 A 7/1998 Nakamura et al.
5,780,876 A 7/1998 Hata ..... 257/103
5,866,440 A 2/1999 Hata
5,903,017 A 5/1999 Itaya et al. ..... 257/190
5,959,307 A 9/1999 Nakamura et al. ..... 257/14
5,990,496 A * 11/1999 Kunisato et al. ..... 257/94
6,072,818 A 6/2000 Hayakawa ..... 372/46
6,081,001 A 6/2000 Funato et al. ..... 257/94
6,147,364 A 11/2000 Itaya et al. ..... 257/76
6,162,656 A * 12/2000 Kunisato et al. ..... 438/46
6,165,812 A 12/2000 Ishibashi et al. ..... 438/46

FOREIGN PATENT DOCUMENTS

CN 1132942 10/1996

(Continued)

OTHER PUBLICATIONS

The First Notice of Reasons for Refusal in the counterpart Japanese application (JP9–055221) dated Jul. 6, 2001 and its translation thereof.

(Continued)

*Primary Examiner*—Long Pham
(74) *Attorney, Agent, or Firm*—Westerman, Hattori, Daniels & Adrian, LLP

(57) ABSTRACT

A method of manufacturing a light emitting device, including the steps of: forming an active layer composed of a compound semiconductor containing indium by a vapor phase growth method; and forming a cap layer composed of a compound semiconductor on said active layer by a vapor phase growth method at a growth temperature approximately equal to or lower than a growth temperature for said active layer.

75 Claims, 5 Drawing Sheets

FOREIGN PATENT DOCUMENTS

| | | | |
|---|---|---|---|
| CN | 341718 | | 10/1998 |
| EP | 0 716 457 | A2 | 6/1966 |
| EP | 0 497 350 | A1 * | 8/1992 |
| EP | 0 497 350 | B1 | 8/1992 |
| EP | 762516 | | 3/1997 |
| JP | 61-131582 | A | 6/1986 |
| JP | 4-297023 | | 10/1992 |
| JP | 4-321280 | | 11/1992 |
| JP | 6-21511 | | 1/1994 |
| JP | 6-53549 | | 2/1994 |
| JP | 6-164055 | | 6/1994 |
| JP | 6-216409 | | 8/1994 |
| JP | 6-283825 | | 10/1994 |
| JP | 7-015041 | | 1/1995 |
| JP | 7-074431 | | 3/1995 |
| JP | 07-106698 | A | 4/1995 |
| JP | 7-162038 | | 6/1995 |
| JP | 7-235723 | | 9/1995 |
| JP | 7-249795 | | 9/1995 |
| JP | 7-267796 | | 10/1995 |
| JP | 7-302929 | | 11/1995 |
| JP | 7-307338 | | 11/1995 |
| JP | 8-18159 | | 1/1996 |
| JP | 8-070139 | | 3/1996 |
| JP | 8-293643 | | 11/1996 |
| JP | 9-64419 | | 3/1997 |
| JP | 9-97921 | | 4/1997 |
| JP | 9-148247 | | 6/1997 |
| JP | 9-148678 | | 6/1997 |
| JP | 9-186363 | | 7/1997 |
| JP | 9-199798 | | 7/1997 |
| JP | 9-232680 | | 9/1997 |
| JP | 9-232685 | | 9/1997 |
| JP | 9-266352 | | 10/1997 |
| JP | 9-283854 | | 10/1997 |
| JP | 9-293897 | | 11/1997 |
| JP | 9-293935 | | 11/1997 |
| JP | 10-126006 | | 5/1998 |
| JP | 9-055221 | | 2/2003 |
| WO | WO 95/17019 | | 6/1995 |
| WO | WO 97/26680 | | 7/1997 |

OTHER PUBLICATIONS

The Second Notice of Reasons for Refusal in the counterpart Japanese application (JP9–055221) dated Nov. 6, 2001 and its translation thereof.

The Third Notice of Reasons for Refusal in the counterpart Japanese application (JP9–055221) dated Mar. 19, 2002 and its translation thereof.

The Fourth Notice of Reasons for Refusal in the counterpart Japanese application (JP9–055221) dated Jul. 30, 2002 and its translation thereof.

The Office Action is the counterpart Chinese application (97110806.4) dated Oct. 11, 2002.

The Decision of Refusal in the counterpart Japanese application (JP107834) and its translation; Mar. 16, 2004.

The Notice of Reasons for Revocation in the counterpart Japanese application (JP2004–079216) and its translation.

J. Appln Phys., vol. 74m No. 6, pp. 3911–3915.

JPN. J. Appl. Phys., vol. 35, pp. L74–L76.

Compound Semiconductor Jan./Feb., p. 7, 1996.

Shuji Nakamura et al., Jpn. J. Appl. Phys. Lett. 69(10) pp. L1477–L1479, Sep. 2, 1996.

Shuji Nakamura et al., Jpn. J. Appl. Phys. vol. 35, pp. L217–L220 Part 2, No. 2B, Feb. 15, 1996.

Shuji Nakamura et al., "Superbright green InGaN single–quantum–well–structure LEDs" Jpn. J. Appl. Phys. Lett, Part 2, Oct. 15, 1995, Japan, vol. 34, No. 10B, pp. L1332–L1335, XP 000 702227.

Shuji Nakamura et al., "III–V nitride–based LEDs" Conf. On Diamond, Diamond–Like and Related Materials, Barcelona, Sep. 10–15, 1995, vol. 5, No. 3–5, pp. 496–500, XP 000 627554.

Notification of Reasons for Refusal dated Mar. 27, 2007 issued in corresponding Japanese Application JP 2003–114877.

Japanese Office Action dated Mar. 31, 2009, issued in Japanese Application No. 2001–267038.

Japanese Office Action mailed Aug. 19, 2008, issued in corresponding Japanese Application No. 2001–267038.

Japanese Office Action dated Jan. 12, 2010, issued in corresponding Japanese Application No. 2001–267038 (With English Translation).

Shuji Nakamura et al.; Jpn. J. Appl. Phys. vol. 35, pp. L74–L76, Part. 1, No. 1B; Jan. 15, 1996.*

Questioning dated Aug. 3, 2010, issued by the Board of appeals in the counterpart Japanese Application No. 2001–007643.

* cited by examiner

MANUFACTURING METHOD OF LIGHT EMITTING DEVICE

Matter enclosed in heavy brackets [ ] appears in the original patent but forms no part of this reissue specification; matter printed in italics indicates the additions made by reissue.

This application is a divisional of prior application Ser. No. 08/847,471, filed Apr. 25, 1997 now U.S. Pat. No. 5,990,496.

BACKGROUND OF THE INVENTION

1. Field of the Invention

The present invention relates to a light emitting device and a manufacturing method thereof.

2. Description of the Background Art

Light emitting devices such as light emitting diodes and semiconductor laser devices which are formed of III-V group nitride system semiconductors such as GaN, AlGaN, InGaN and InAlGaN are receiving a great deal of attention because they are capable of, by direct transition, light emission in the yellow to ultraviolet region, especially in the blue region, with large luminous intensity.

FIG. 8 is a schematic cross-sectional view showing a conventional light emitting diode composed of III-V group nitride system semiconductors.

In FIG. 8, formed in order on a sapphire substrate 101 are a GaN buffer layer 102, an n-type GaN contact layer 103 also serving as an n-type cladding layer, an InGaN active layer 104, a p-type AlGaN cladding layer 105, and a p-type GaN contact layer 106. A p electrode 107 is formed on the p-type GaN contact layer 106 and an n electrode 108 is formed on the n-type GaN contact layer 103.

The individual layers of this light emitting diode are grown by metal organic chemical vapor deposition (MOCVD) at the growth temperatures shown in Table 1, for example.

TABLE 1

| Name of layer | Growth temperature (° C.) |
|---|---|
| Buffer layer 102 | 600 |
| N-type contact layer 103 | 1150 |
| Active layer 104 | 860 |
| P-type cladding layer 105 | 1150 |
| P-type contact layer 106 | 1150 |

When manufacturing this light emitting diode, the p-type AlGaN cladding layer 105 is formed on the InGaN active layer 104 at a growth temperature higher than that for the InGaN active layer 104 to achieve good crystallinity. The growth of the p-type AlGaN cladding layer 105 at such a high temperature causes elimination of constituent elements such as In from the InGaN active layer 104. The crystallinity of the InGaN active layer 104 is thus deteriorated when crystal-growing the p-type AlGaN cladding layer 105. This causes difficulty in achieving larger luminous intensity with the light emitting diode.

SUMMARY OF THE INVENTION

An object of the present invention is to provide a light emitting device having high luminous intensity and its manufacturing method.

A light emitting device according to the present invention includes, in this order, a first cladding layer composed of a compound semiconductor of a first conductivity type, an active layer composed of a compound semiconductor containing indium, a cap layer composed of a compound semiconductor, and a second cladding layer composed of a compound semiconductor of a second conductivity type.

In the light emitting device of the invention, formation of the cap layer on the active layer suppresses elimination of constituent elements such as indium from the active layer. This provides increased luminous intensity.

The first cladding layer is composed of a nitride system semiconductor of the first conductivity type, the active layer is composed of a nitride system semiconductor, the cap layer is composed of a nitride system semiconductor, and the second cladding layer is composed of a nitride system semiconductor of the second conductivity type.

The first cladding layer may be composed of a III-V group nitride system semiconductor of the first conductivity type, the active layer of a III-V group nitride system semiconductor, the cap layer of a III-V group nitride system semiconductor, and the second cladding layer of a III-V group nitride system semiconductor of the second conductivity type. It is preferable to form the cap layer on the entire surface of the active layer in close contact.

The active layer may be composed of an InGaN layer. This provides remarkable effect since indium is susceptible to elimination. The cap layer may be formed of an AlGaN layer, and is preferably formed of a GaN layer.

The cap layer of $Al_uGa_{1-u}N$, and the second cladding layer of $Al_zGa_{1-z}N$ of the second conductivity type, wherein the Al composition ratio u of the cap layer is preferably smaller than the Al composition ratio z of the second cladding layer. It is preferable from the point of view of manufacturing yield that the first cladding layer is formed of GaN.

Particularly, it is more preferable that the Al composition ratio u of the cap layer is approximately 0.1 or smaller. It is more preferable that the cap layer is formed of GaN. In this case, the cap layer formed of a GaN layer suppresses elimination of constituent elements such as indium from the active layer. This provides significantly larger luminous intensity.

The cap layer preferably has a larger bandgap than the active layer. This prevents the cap layer from serving as a light emitting region.

It is preferable that the cap layer has a bandgap intermediate between those of the active layer and the second cladding layer. This allows reduction of the operating voltage.

It is preferable that the cap layer has impurity concentration lower than that of the second cladding layer. This reduces the possibility of undesirable impurity diffusion from the cap layer side into the active layer, thus suppressing deterioration of luminous intensity due to undesirable impurity diffusion.

Particularly, it is more preferable that the cap layer is an undoped layer. This allows almost no undesirable impurity diffusion from the cap layer side into the active layer. This sufficiently suppresses luminous intensity deterioration due to undesirable impurity diffusion.

It is preferable that the cap layer has a thickness of approximately not less than 200 Å and approximately not more than 400 Å. This provides significantly increased luminous intensity.

The first cladding layer may be formed on a substrate composed of a semiconductor or an insulator with a buffer layer composed of $Al_xGa_{1-x}N$ interposed therebetween, and the Al composition ratio x of the buffer layer is preferably larger than 0 and not larger than 1. This improves the manufacturing yield.

Particularly, it is more preferable that the Al composition ratio x of the buffer layer is 0.4 or larger, and smaller than 1. This further improves the manufacturing yield. It is still more preferable that the Al composition ratio x of the buffer layer is not less than 0.4, and not more than 0.6. This still further improves the manufacturing yield.

The light emitting device may further include an underlayer composed of $Al_yGa_{1-y}N$ between the buffer layer and the first cladding layer, wherein the Al composition ratio y of the underlayer is preferably 0 or larger, and smaller than 1. This improves the manufacturing yield.

A method of manufacturing a light emitting device according to another aspect of the present invention includes the steps of forming an active layer composed of a compound semiconductor containing indium by a vapor phase growth method and forming a cap layer composed of a compound semiconductor on the active layer by a vapor phase growth method at a temperature approximately equal to or lower than a growth temperature for the active layer.

According to the manufacturing method of the invention, formation of the cap layer on the active layer at a growth temperature approximately equal to or lower than the growth temperature for the active layer suppresses elimination of constituent elements such as indium from the active layer. This provides larger luminous intensity.

The manufacturing method of the present invention may further include the step of forming a cladding layer composed of a compound semiconductor on the cap layer by a vapor phase growth method at a growth temperature higher than the growth temperature allowing crystal growth of the active layer.

The active layer may be composed of a nitride system semiconductor and the cap layer of a nitride system semiconductor. The cladding layer may be formed of a nitride system semiconductor of one conductivity type.

The active layer may be composed of a III-V group nitride system semiconductor and the cap layer of a III-V group nitride system semiconductor. The cladding layer may be formed of a III-V group nitride system semiconductor of one conductivity type. Particularly, the active layer may be formed of an InGaN layer. In this case, a remarkable effect is obtained since indium is susceptible to elimination.

It is preferable that the cap layer is composed of $Al_uGa_{1-u}N$, the cladding layer is composed of $Al_zGa_{1-z}N$ of one conductivity type, and that the Al composition ratio u of the cap layer is smaller than the Al composition ratio z of the cladding layer.

Particularly, it is preferable that the Al composition ratio u of the cap layer is approximately 0.1 or smaller. It is more preferable that the cap layer is composed of GaN. In this case, since the cap layer is formed of a GaN layer, elimination of constituent elements such as indium from the active layer is suppressed, thus providing significantly larger luminous intensity.

Particularly, it is preferable that the cap layer is an undoped layer. In this case, there is almost no possibility a of diffusion of undesirable impurities from the cap layer side to the active layer side. This sufficiently suppresses deterioration of luminous intensity due to undesirable impurity diffusion.

It is preferred that the cap layer has a thickness of approximately not smaller than 200 Å and approximately not larger than 400 Å. This enables remarkable improvement of the luminous intensity.

It is preferable to form the cap layer at a growth temperature approximately equal to that for the active layer. This allows the cap layer to be continuously formed without a time interval after formation of the active layer, which considerably prevents elimination of constituent elements from the active layer.

The growth temperature for the cap layer is preferably set to a temperature which allows crystal growth of the active layer. The active layer is preferably formed at a growth temperature not lower than 700° C. and not higher than 950° C. The cap layer is preferably formed at a growth temperature not lower than 700° C. and not higher than 950° C. The formation of the cap layer on the active layer at a low growth temperature suppresses elimination of constituent elements such as indium from the active layer.

It is preferable that the active layer has a quantum well structure including an InGaN quantum well layer and a GaN quantum barrier layer and the GaN quantum barrier layer is formed by a vapor phase growth method at a growth temperature not lower than 700° C. and not higher than 950°. In this case, elimination of constituent elements such as indium from the InGaN quantum well layer is suppressed, thus enabling larger luminous intensity. An InGaN having an In composition ratio lower than that of the quantum well layer may be used as the quantum barrier layer.

A method of manufacturing a light emitting device according to still another aspect of the present invention includes the steps of forming a first cladding layer composed of a compound semiconductor of a first conductivity type by a vapor phase growth method, forming an active layer composed of a compound semiconductor containing indium by a vapor phase growth method on the first cladding layer, forming a cap layer composed of a compound semiconductor on the active layer by a vapor phase growth method at a growth temperature approximately equal to or lower than a temperature allowing vapor phase growth of the active layer, and forming a second cladding layer composed of a compound semiconductor of a second conductivity type on the cap layer by a vapor phase growth method at a temperature higher than the temperature allowing vapor phase growth of the active layer.

The first cladding layer may be composed of a nitride system semiconductor of the first conductivity type, the active layer of a nitride system semiconductor, the cap layer of a nitride system semiconductor, and the second cladding layer of a nitride system semiconductor of the second conductivity type.

The first cladding layer may be formed of a III-V group nitride system-semiconductor of the first conductivity type, the active layer of a III-V group nitride system semiconductor, the cap layer of a III-V group nitride system semiconductor, and the second cladding layer of a III-V group nitride system semiconductor of the second conductivity type.

It is preferable to form a buffer layer composed of a non-single-crystal III-V group nitride system semiconductor and a single-crystal underlayer composed of an undoped III-V group nitride system semiconductor in this order on a substrate and then perform crystal growth for the first cladding layer, the active layer, the cap layer and the second cladding layer. It is preferable that the buffer layer is formed of AlGaN. The buffer layer may be formed of AlN. The underlayer is preferably formed of GaN and the underlayer may be formed of AlGaN.

These and other objects, features, aspects and advantages of the present invention will become more apparent from the following detailed description of the present invention when taken in conjunction with the accompanying drawings.

DESCRIPTION OF THE PREFERRED EMBODIMENT

A light emitting diode composed of III-V group nitride system semiconductors according to a first embodiment of the present invention will now be described in detail referring to FIG. 1.

Figure 1:
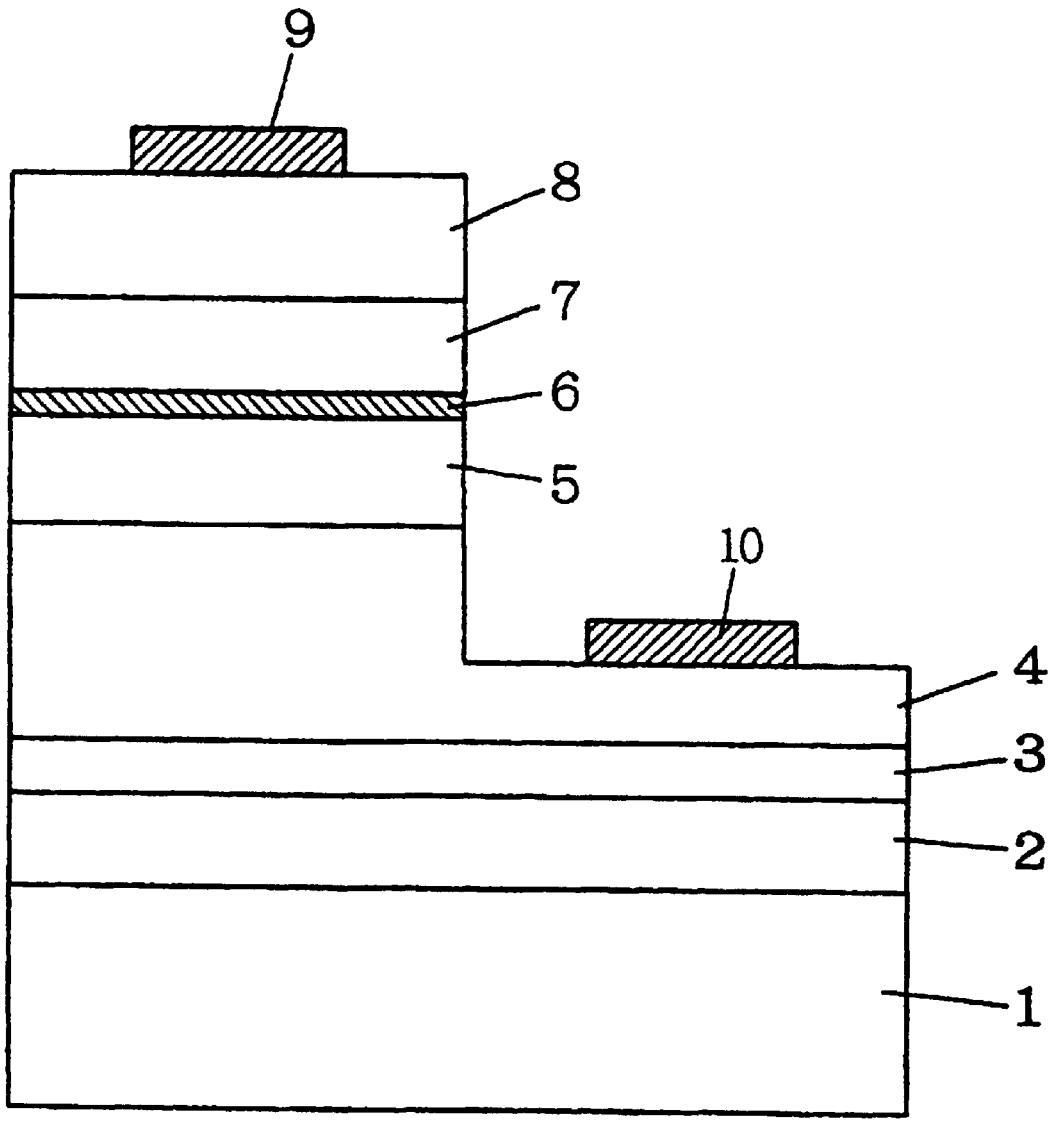
FIG. 1 is a schematic cross-sectional diagram of a light emitting diode according to a first embodiment of the present invention.

In FIG. 1, formed in order on a sapphire insulating substrate 1 are a 110-Å-thick undoped $Al_xGa_{1-x}N$ (x=0.5) buffer layer 2, a 0.2-μm-thick undoped GaN underlayer 3, a 4-μm-thick Si-doped n-type GaN contact layer 4 also serving as an n-type cladding layer, and a 0.2-μm-thick Zn- and Si-doped $In_qGa_{1-q}N$ (q=0.05) active layer 5. Formed in order on the InGaN active layer 5 are a 200-Å-thick undoped GaN cap layer 6 for preventing crystal deterioration of the active layer 5, a 0.15-μm-thick Mg-doped p-type $Al_zGa_{1-z}N$ (z=0.2) cladding layer 7, and a 0.3-μm-thick Mg-doped p-type GaN contact layer 8.

The part from the p-type GaN contact layer 8 to a certain position in the n-type GaN contact layer 4 is removed, so that the n-type GaN contact layer 4 is exposed. A p electrode 9 composed of Au is formed on the upper surface of the p-type GaN contact layer 8 and an n electrode 10 composed of Al is formed on the n electrode formation region where the n-type GaN contact layer 4 is exposed.

A method of manufacturing the above-described light emitting diode will be explained. In this embodiment, the individual layers are formed by metal organic chemical vapor deposition (MOCVD).

First, the substrate 1 is placed in a metal organic chemical vapor deposition apparatus. Then, with the substrate 1 held at a non-single crystal growth temperature, e.g., a growth temperature (a substrate temperature) of 600° C., the non-single-crystal undoped AlGaN buffer layer 2 is grown on the substrate 1 by using $H_2$ and $N_2$ as carrier gas and ammonia, trimethylgallium (TMG) and trimethylaluminum (TMA) as material gas.

Subsequently, with the substrate 1 held at a single crystal growth temperature, or a growth temperature preferably of 1000–1200° C., e.g., 1150° C., the single-crystal undoped GaN underlayer 3 is grown on the buffer layer 2 by using $H_2$ and $N_2$ as carrier gas and ammonia and trimethylgallium (TMG) as material gas.

Then with the substrate 1 held at a single crystal growth temperature, or a growth temperature preferably of 1000–1200° C., e.g., 1150° C., the single-crystal Si-doped n-type GaN contact layer 4 is grown on the underlayer 3 by using $H_2$ and $N_2$ as carrier gas, ammonia and trimethylgallium (TMG) as material gas, and $SiH_4$ as dopant gas.

Next, with the substrate 1 held at a single crystal growth temperature, or preferably at a growth temperature of 700–950° C., e.g., at 860° C., the single-crystal Si- and Zn-doped InGaN active layer 5 is grown on the n-type contact layer 4 by a1) using $H_2$ and $N_2$ as carrier gas, ammonia, triethylgallium (TEG) and trimethylindium (TMI) as material gas, and $SiH_4$ and diethylzinc (DEZ) as dopant gas.

Subsequently, with the substrate 1 held at a temperature equal to or lower than the growth temperature for the active layer 5, or at 860° C. in this embodiment, the single-crystal undoped GaN cap layer 6 is grown on the InGaN active layer 5 continuously following the growth of the active layer 5 by using $H_2$ and $N_2$ as carrier gas, and ammonia and trimethylgallium (TMG) as material gas. Triethylgallium (TEG) may be used in place of trimethylgallium (TMG).

Then with the substrate 1 held at a single crystal growth temperature, i.e., preferably at a growth temperature of 1000–1200° C., e.g.. at 1150° C., the single-crystal Mg-doped p-type AlGaN cladding layer 7 is grown on the GaN cap layer 6 by using $H_2$ and $N_2$ as carrier gas, ammonia, trimethylgallium (TMG) and trimethylaluminum (TMA) as material gas, and $Cp_2Mg$ (cyclopentadienylmagnesium) as dopant gas.

Next, with the substrate 1 held at a single crystal growth temperature, i.e., preferably at a growth temperature of 1000–1200° C., e.g., at 1150° C., the single-crystal Mg-doped p-type GaN contact layer 8 is grown on the p-type cladding layer 7 by using $H_2$ and $N_2$ as carrier gas, ammonia and trimethylgallium (TMG) as material gas, and $Cp_2Mg$ (cyclopentadienylmagnesium) as dopant gas.

After the crystal growth, the substrate 1 is taken out from the apparatus and the part from the p-type contact layer 8 to the midway in the n-type contact layer 4 is removed by reactive ion beam etching (RIE) to form the n electrode formation region in which the n-type contact layer 4 is exposed.

Then a heat treatment is performed at 750–800° C. for 30–60 minutes in an atmosphere of nitrogen to activate the dopants in the p-type contact layer 8 and the p-type cladding layer 7 to obtain high carrier concentration and to correct crystal deterioration in the n-type contact layer 4 caused by the etching.

Then the p electrode 9 composed of Au is formed by evaporation, or the like, on the p-type contact layer 8 and the n electrode 10 composed of Al is formed by evaporation or the like on the n electrode formation region of the n-type contact layer 4. A heat treatment at 500° C. is then applied to cause the p electrode 9 and the n electrode 10 to come into ohmic contact with the p-type contact layer 8 and the n-type contact layer 4, respectively, to form the light emitting diode shown in FIG. 1.

This light emitting diode, having the undoped GaN cap layer 6 in close contact with the InGaN active layer 5, prevents elimination of constituent elements such as In from the InGaN active layer 5 in or after formation of the active layer 5. This reduces the number of crystal defects in the active layer 5, suppressing deterioration of the crystallinity.

Furthermore, it is thought that undesirable impurity diffusion into the active layer 5 is suppressed since it has a less number of crystal defects.

Moreover, since the GaN cap layer 6 of this embodiment is a so-called undoped layer formed without intentional use of dopant, undesirable impurity diffusion into the InGaN active layer 5 is sufficiently suppressed.

As discussed above, in this embodiment, the effect of suppressing impurity diffusion into the active layer 5 is produced because the number of crystal defects in the active layer 5 is reduced by suppressing elimination of constituent elements from the active layer 5 and the effect of suppressing impurity diffusion into the active layer 5 is produced because the cap layer 6 is an undoped layer which remarkably suppresses undesirable impurity diffusion into the active layer 5.

Accordingly, while light emitting diodes having the same structure as this embodiment except that they have no cap layer 6 suffer from large variations in light emission wavelength, no light emission or low light emission, the light emitting diode of this embodiment achieves small variations in the light emission wavelength and considerably increased luminous intensity.

Particularly, when manufacturing the light emitting diode of this embodiment, the undoped GaN cap layer 6 is grown right on the entire surface of the InGaN active layer 5 at a temperature not higher than the growth temperature for the InGaN active layer 5. This not only prevents elimination -7 constituent elements of the InGaN active layer 5 when forming the cap layer 6 but also prevents elimination of constituent elements from the InGaN active layer 5 after formation of the cap layer 6. Accordingly, the manufacturing method of this embodiment is desirable.

Especially, in this embodiment, continuously growing the InGaN active layer 5 and the GaN cap layer 6 at approximately equal growth temperatures sufficiently suppresses elimination of constituent elements from the InGaN active layer 5 and mass productivity is improved.

With the aforementioned structure, the luminous intensity was 340 (arbitrary unit) with a 200-Å-thick GaN cap layer 6. With a 100-Å-thick GaN cap layer 6, the luminous intensity was 36 (arbitrary unit). This is larger than that of a structure having no cap layer 6, but is about one-tenth that of the 200-Å-thick cap layer 6. With a 300-Å-thick GaN cap layer 6, the luminous intensity was 1.4 times that of the 200-Å-thick one, and with a 400-Å-thick GaN cap layer 6, it was 0.8 times that of the 200-Å-thick one.

This suggests that a preferable effect is obtained when the GaN cap layer 6 has a thickness between 200–400 Å, or that it is preferable that the GaN cap layer 6 has a thickness large enough to cause almost no quantum effect.

In this embodiment, the non-single-crystal AlGaN buffer layer 2 is formed on the substrate 1 and then the undoped GaN single-crystal underlayer 3 is formed under single crystal growth conditions. This easily provides the underlayer 3 with remarkably improved surface conditions, which suppresses leakage current of the device and increases manufacturing yield of the devices.

When a GaN layer is used as the non-single-crystal buffer layer 2, it is likely to suffer from pits in the surface, which may lead to through defects. It is therefore undesirable to use a GaN layer as the buffer layer 2 from the point of view of the manufacturing yield. As a non-single crystal buffer layer 2 used in combination with the undoped single-crystal underlayer 3, use of an AlN layer is preferable in the point of view of the manufacturing yield, and the use of an AlGaN layer is the most desirable.

The surface conditions and FWHM (Full Width Half Maximum) of X-ray diffraction spectrum were measured with AlGaN layers having various Al composition ratios. Table 2 below shows the measurements.

TABLE 2

| Al composition | Surface conditions | X-ray FWHM (arcsec) |
|---|---|---|
| 1.0 | good | 550 |
| 0.8 | good | 504 |
| 0.6 | good | 451 |
| 0.4 | good | 390 |
| 0.2 | many pits | 428 |
| 0 | many pits | unknown |

The results in Table 2 show that it is desirable that the AlGaN layer has an Al composition ratio of 0.4 or greater, and smaller than 1, and more desirably, not smaller than 0.4 nor larger than 0.6.

As the undoped single-crystal underlayer 3, an AlGaN layer may be used in place of the GaN layer, but an AlN layer is not preferable because it is likely to suffer from cracking on the surface.

Next, a light emitting diode formed of III-V group nitride system semiconductors in a second embodiment of the present invention will be described.

This embodiment differs from the first embodiment in that it uses a 200-Å-thick undoped $Al_uGa_{1-u}N$ layer as the cap layer 6 in place of the undoped GaN layer. The value of u is approximately 0.1 and 0.2. This $Al_uGa_{1-u}N$ layer, too, is formed by MOCVD at the same temperature as the growth temperature for the active layer 5, at 860° C. in this embodiment. $H_2$ and $N_2$ are used as carrier gas and ammonia, trimethylgallium (TMG) and trimethylaluminum (TMA) are used as material gas. Triethylgallium (TEG) may be used instead of trimethylgallium (TMG).

It was seen that the light emitting diode of this embodiment also provides remarkably larger luminous intensity than a light emitting diode having no cap layer 6.

However, as compared with the 200-Å-thick undoped GaN cap layer 6 in the first embodiment regarded as providing a luminous intensity of 450 (arbitrary unit), an undoped $Al_uGa_{1-u}N$ cap layer 6 with an Al composition ratio u of about 0.1 in the second embodiment provided a luminous intensity smaller than half thereof, 190 (arbitrary unit).

With an undoped $Al_uGa_{1-u}N$ cap layer 6 having an Al composition ratio u of about 0.2, the luminous intensity was one-third that for the Al composition ratio u of 0.1.

This shows that it is the most preferable to use a GaN layer as the cap layer 6 and that when using an $Al_uGa_{1-u}N$ layer, a small Al composition ratio u as 0.1 is preferable. The larger an Al composition ratio is, the larger the bandgap of an AlGaN is. The Al composition ratio of the p-type cladding layer 7 is 0.2 as described in the first embodiment. When the Al composition ratio of the cap layer 6 is 0.1, the bandgap of the cap layer 6 is smaller than that of the p-type cladding layer 7. From this, it is understood that it is preferable that the cap layer 6 has a bandgap between that of the active a layer 5 and that of the p-type cladding layer 7.

Figure 2:
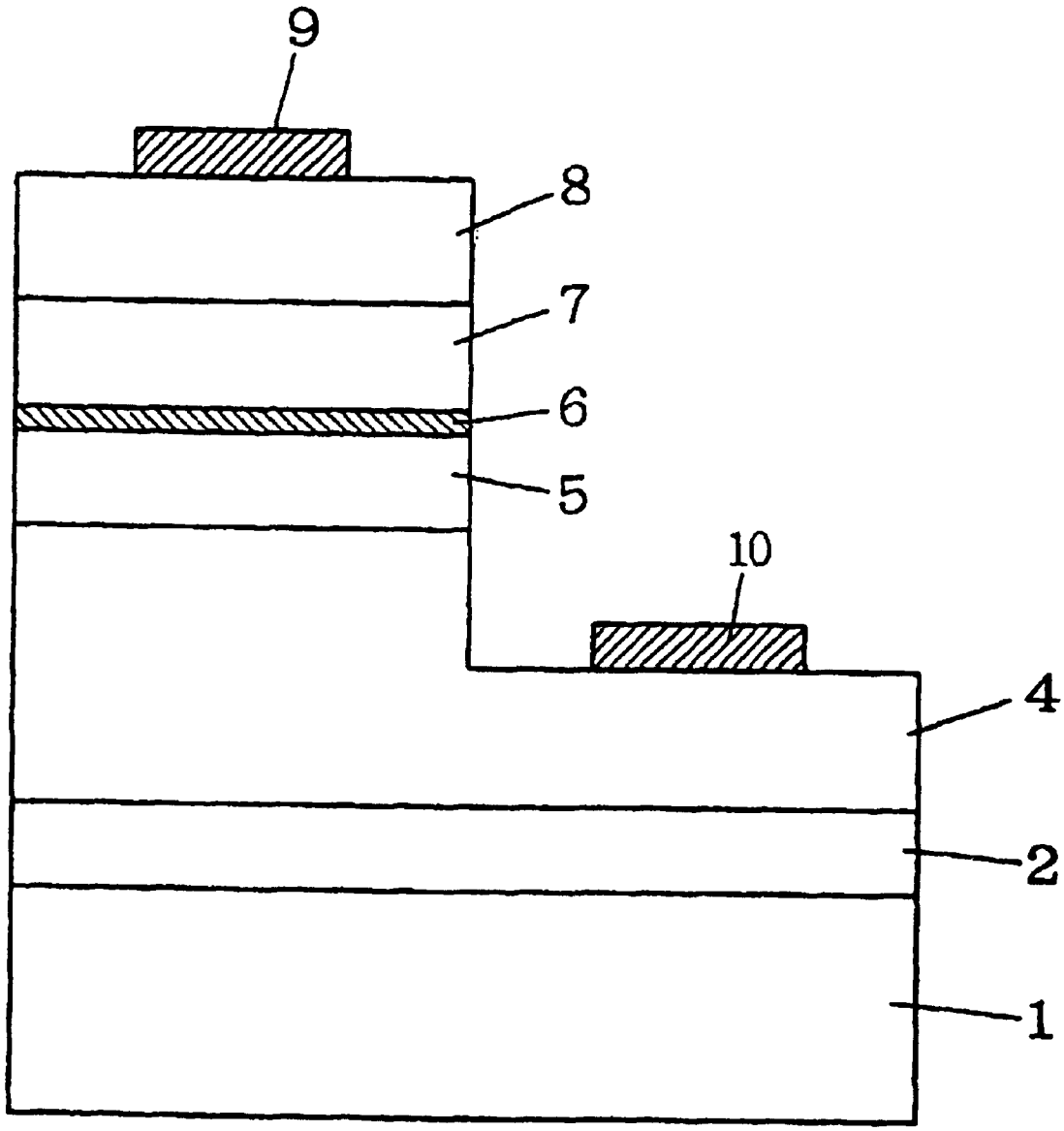
FIG. 2 is a schematic cross-sectional diagram of a light emitting diode according to a third embodiment of the present invention.

Next, a light emitting diode composed of III-V group nitride system semiconductors in a third embodiment of the invention will be described referring to FIG. 2.

This embodiment differs from the first embodiment in that it uses no GaN underlayer 3, whose manufacturing method is the same as that in the first embodiment except that it excludes the process step for forming the GaN underlayer 3.

While the light emitting diode of this embodiment provides lower yield than the light emitting diode of the first embodiment, it achieves larger luminous intensity than a light emitting diode having no cap layer 6.

Although the light emitting diodes of the above-described embodiments have the active layer 5 on the n-type contact layer 4, an n-type AlGaN cladding layer may be provided between the n-type contact layer 4 and the active layer 5. An n-type AlGaN cladding layer and an n-type InGaN layer may be provided between the n-type contact layer 4 and the active layer 5.

The aforementioned embodiments use an active layer with a non-quantum-well structure as the active layer 5, rather than a quantum-well structure. However, needless to say, an active layer with a single-quantum-well structure or a multi-quantum-well structure may be used. For example, the active layer may have a single-quantum-well structure formed of an $In_zGa_{1-z}N$ (1>s>0) quantum well layer, or a multi-quantum-well structure formed of an $In_zGa_{1-z}N$ (1>s>0) quantum well layer and an $In_rGa_{1-r}N$ (1>s>r≧0) quantum barrier layer.

When using a multi-quantum-well structure formed of an $In_sGa_{1-s}N$ (1>s>0) quantum well layer and a GaN quantum barrier layer, it is preferable to form the GaN quantum barrier layer at a growth temperature not lower than 700° C. nor higher than 950° C., and it is also preferable to grow the quantum well layer and the quantum barrier layer at approximately equal growth temperatures.

Although the light emitting diodes of the embodiments use an Si- and Zn-doped active layer 5, an undoped active layer may be used.

Next, an index guided semiconductor laser device in a fourth embodiment of the present invention will be explained referring to FIG. 3. This semiconductor laser device is a self-aligned semiconductor laser device.

Figure 3:
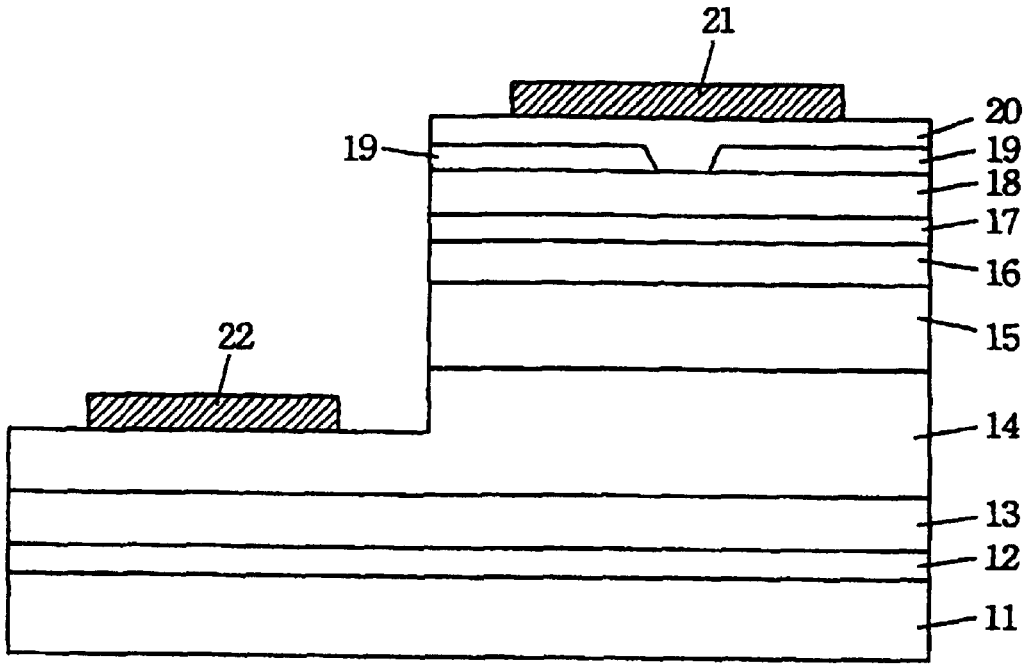
FIG. 3 is a schematic cross-sectional diagram of a semiconductor laser device according to a fourth embodiment of the present invention.

In FIG. 3, formed in order on a sapphire insulating substrate 11 are an undoped AlGaN buffer layer 12 with a thickness of about 100–200 Å, an undoped GaN underlayer 13 with a thickness of 0.4 μm, an n-type GaN contact layer 14 with a thickness of 4 μm, and an n-type AlGaN cladding layer 15 with a thickness of 0.1–0.5 μm. Formed in order on the n-type AlGaN cladding layer 15 are an InGaN active layer 16, an undoped GaN cap layer 17 with a thickness of 200–400 Å, and a p-type AlGaN cladding layer 18 with a thickness of 0.1–0.5 μm.

An n-type GaN or n-type AlGaN current blocking layer 19 with a thickness of 0.2–0.3 μm having a stripe-like opening in the center part is formed on the p-type AlGaN cladding layer 18. A p-type GaN contact layer 20 having a thickness of 0.1–0.5 μm is formed on the top surface and in the stripe-like opening of the n-type current blocking layer 19.

A p electrode 21 is formed on the p-type GaN contact layer 20 and an n electrode 22 is formed on the n-type GaN contact layer 14.

As the active layer 16, a non-quantum-well structure layer may be used, or a single-quantum-well structure layer or a multi-quantum-well layer may be used. In the case of a non-quantum-well structure layer, the thickness is set to about 0.1 to 0.3 μm. In the case of a single-quantum-well structure layer, the thickness of the quantum well layer is set to 10–50 Å, and in the case of a multi-quantum-well structure layer, the thickness of the quantum well layer is set to 10–50 Å and the thickness of the quantum barrier layer is set to about 10–100 Å, This semiconductor laser device is manufactured by performing crystal growth once by using chemical vapor deposition, such as MOCVD. When manufacturing, the undoped AlGaN buffer layer 12 is formed at a growth temperature or 600° C., the undoped GaN underlayer 13, the n-type GaN contact layer 14 and the n-type AlGaN cladding layer 15 are formed at a growth temperature of 1150° C., the InGaN active layer 16 and the GaN cap layer 17 are formed at a growth temperature of 700–950° C., and the p-type AlGaN cladding layer 18, the n-type current blocking layer 19 and the p-type GaN contact layer 20 are formed at a growth temperature of 1150° C.

The semiconductor laser device of this embodiment also provides larger luminous intensity than a semiconductor laser device having no cap layer 17.

Next, an index guided semiconductor laser device according to a fifth embodiment of the invention will be explained referring to FIG. 4. This semiconductor laser device is a ridge-buried type semiconductor laser device.

Figure 4:
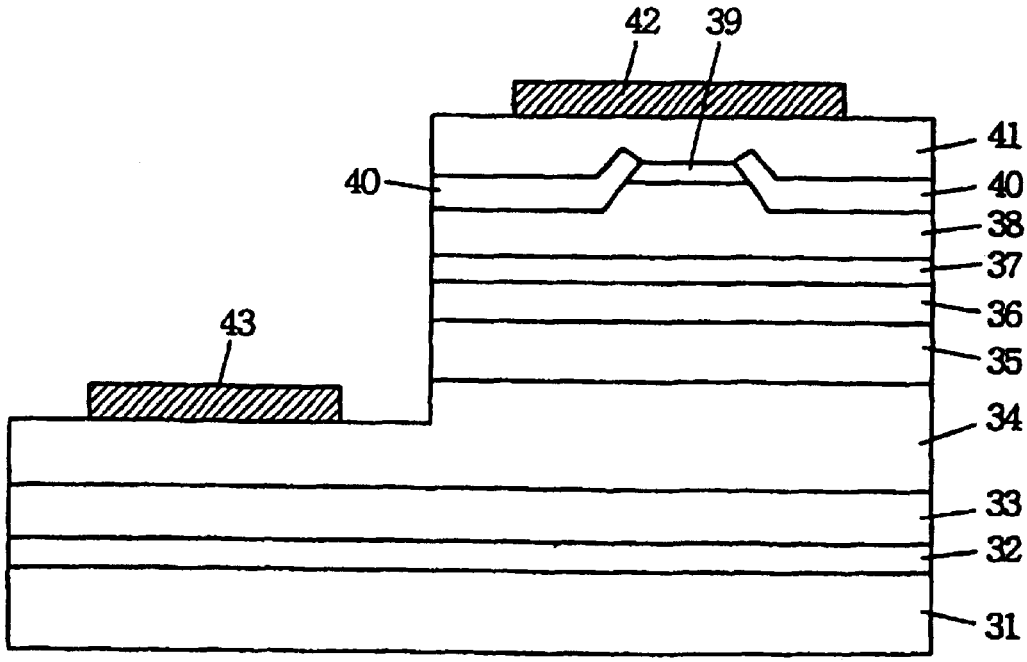
FIG. 4 is a schematic cross-sectional diagram of a semiconductor laser device according to a fifth embodiment of the present invention.

In FIG. 4, formed in order on a sapphire insulating substrate 31 are an undoped AlGaN buffer layer 32 with a thickness of 100–200 Å, an undoped GaN underlayer 33 with a thickness of 0.4 μm, an n-type GaN contact layer 34 with a thickness of 4 μm, and an n-type AlGaN cladding layer 35 with a thickness of 0.1–0.5 82 m. Formed in order on the n-type AlGaN cladding layer 35 are an InGaN active layer 36, an undoped GaN cap layer 37 with a thickness of 200–400 Å, and a p-type AlGaN cladding layer 38 with a thickness of 0.1–0.5 μm. The InGaN active layer 36 has the same structure and thickness as the InGaN active layer 16 in the fourth embodiment.

The p-type AlGaN cladding layer 38 has a flat region and a ridge region formed in the center of the flat region. A p-type GaN cap layer 39 having a thickness of 0.1 μm is formed on the ridge region of the p-type AlGaN cladding layer 38. An n-type GaN or n-type AlGaN current blocking layer 40 having a thickness of 0.2–0.3 μm is formed on the upper surface of the flat region and the side surfaces of the ridge region of the p-type AlGaN cladding layer 38 and on the side surfaces of the p-type cap layer 39. A p-type GaN contact layer 41 having a thickness of 0.1–0.5 μm is formed on the p-type cap layer 39 and the n-type current blocking layer 40.

A p electrode 42 is formed on the p-type GaN contact layer 41 and an n electrode 43 is formed on the n-type GaN contact layer 34.

This semiconductor laser device is manufactured by performing crystal growth three times by using chemical vapor deposition such as MOCVD. When manufacturing, the undoped AlGaN buffer layer 32 is formed at a growth temperature of 600° C., the undoped GaN underlayer 33, the n-type GaN contact layer 34 and the n-type AlGaN cladding layer 35 are formed at a growth temperature of 1150° C., the InGaN active layer 36 and the undoped GaN cap layer 37 are formed at a growth temperature of 700–950° C., and the n-type AlGaN cladding layer 38, the p-type cap layer 39, the n-type current blocking layer 40 and the p-type GaN contact layer 41 are formed at a growth temperature of 1150° C.

The semiconductor laser device of this embodiment also provides larger luminous intensity than a semiconductor laser device having no cap layer 37.

Next, a gain guided semiconductor laser device according to a sixth embodiment of the invention will be described referring to FIG. 5.

Figure 5:
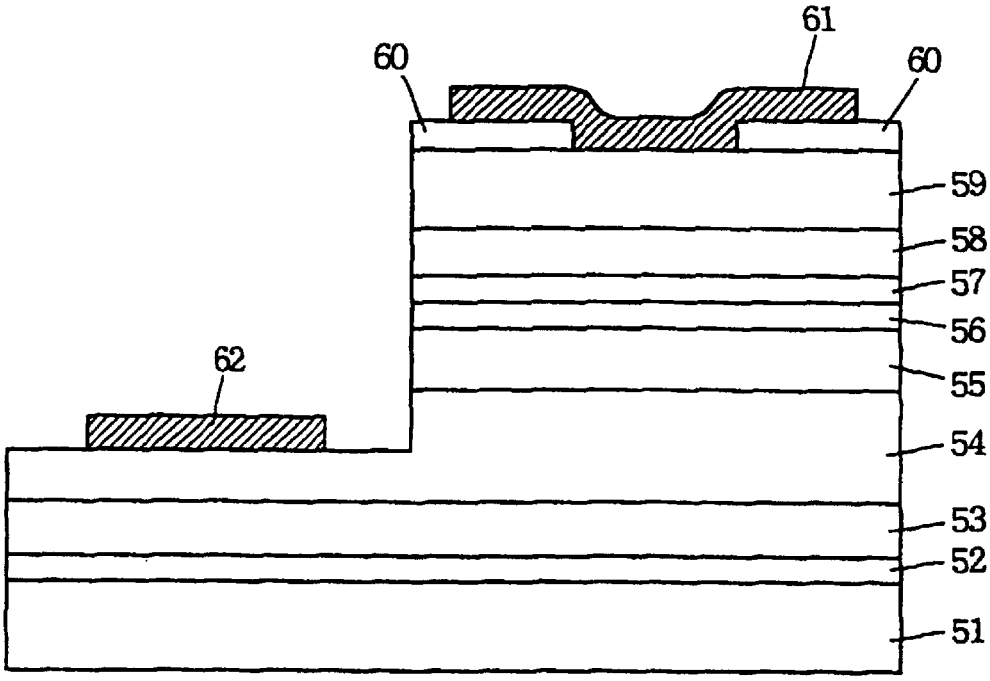
FIG. 5 is a schematic cross-sectional diagram of a semiconductor laser device according to a sixth embodiment of the present invention.

In FIG. 5, formed in order on a sapphire insulating substrate 51 are an undoped AlGaN buffer layer 52 having a thickness of 100–200 Å, an undoped GaN underlayer 53 having a thickness of 0.4 μm, an n-type GaN contact layer 54 having a thickness of 4 μm, and an n-type AlGaN cladding layer 55 having a thickness of 0.1–0.5 μm.

Formed in order on the n-type AlGaN cladding layer 55 are an InGaN active layer 56, an undoped GaN cap layer 57 having a thickness of 200–400 Å, a p-type AlGaN cladding layer 58 having a thickness of 0.1–0.5 μm, and a p-type GaN contact layer 59 having a thickness of 0.1–0.5 μm. The InGaN active layer 56 has the same structure and thickness as the InGaN active layer 16 in the fourth embodiment.

An $SiO_2$, SiN, or n-type GaN current blocking layer 60 having a stripe-like opening in the center is formed on the p-type GaN contact layer 59. A p electrode 61 is formed on the p-type GaN contact layer 59 and an n electrode 62 is formed on the n-type GaN contact layer 54.

The semiconductor laser device of this embodiment is formed by performing crystal growth once by using chemical vapor deposition such as MOCVD. When manufacturing, the undoped AlGaN buffer layer 52 is formed at a growth temperature of 600° C., the undoped GaN underlayer 53, the n-type GaN contact layer 54 and the n-type AlGaN cladding layer 55 are formed at a growth temperature of 1150° C., the InGaN active layer 56 and the undoped GaN cap layer 57 are formed at a growth temperature of 700–950° C., and the p-type AlGaN cladding layer 58 and the p-type GaN contact layer 59 are formed at a growth temperature of 1150° C.

The semiconductor laser device of this embodiment, too, provides larger luminous intensity than a semiconductor laser device having no cap layer 57.

Although the first to sixth embodiments have shown light emitting devices having semiconductor layers on an insulating substrate, the present invention can be similarly applied to light emitting devices having semiconductor layers on a conductive substrate such as an SiC substrate and electrodes on the top surface of the uppermost layer of the semiconductor layers and on the lower surface of the substrate.

Although an active layer, a cap layer and a p-type cladding layer are formed in this order on an n-type cladding layer in the structures explained above, an active layer, a cap layer and an n-type cladding layer may be formed in this order on a p-type cladding layer. That is to say, the individual layers in the first to sixth embodiments may have the opposite conductivity types.

The first to sixth embodiments have described applications of this invention to light emitting devices such as light emitting diodes and semiconductor laser devices, but the present invention is also applicable to semiconductor devices having a compound semiconductor laser containing In such as field effect transistors.

Figure 6:
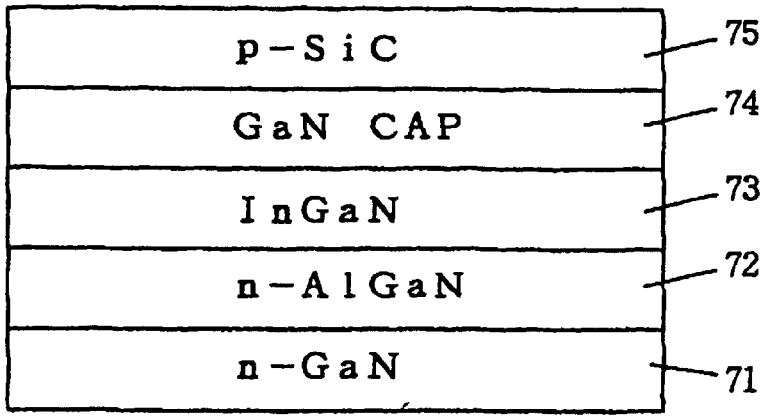
FIG. 6 is a schematic cross-sectional diagram showing an example of a structure to which the present invention can be applied.

With the structure shown in FIG. 6, for example, an n-type AlGaN layer 72 and an InGaN layer 73 are formed in order on an n-type GaN layer 71 and a p-type SiC layer 75 is formed above the InGaN layer 73 with an undoped GaN cap layer 74 therebetween. In this case, the InGaN layer 73 and the GaN cap layer 74 are formed at a growth temperature of 700–950° C. and the p-type SiC layer 75 is formed at a growth temperature of 1300–1500° C. In this example, as well, formation of the undoped GaN cap layer 74 on the InGaN layer 73 suppresses elimination of constituent elements such as In from the InGaN layer 73.

Figure 7:
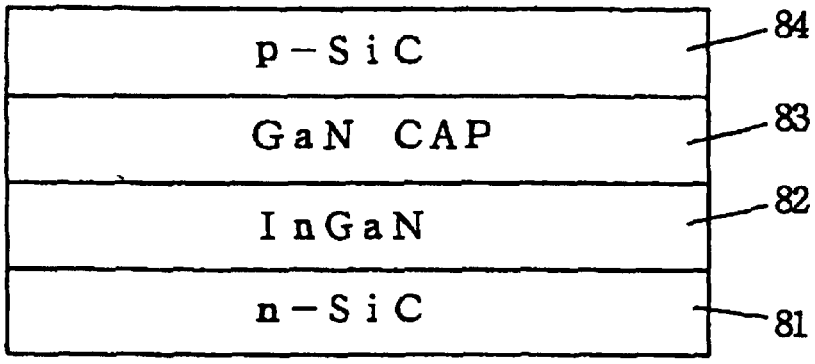
FIG. 7 is a schematic cross-sectional diagram showing another example of a structure to which the present invention is applicable.
Figure 8:
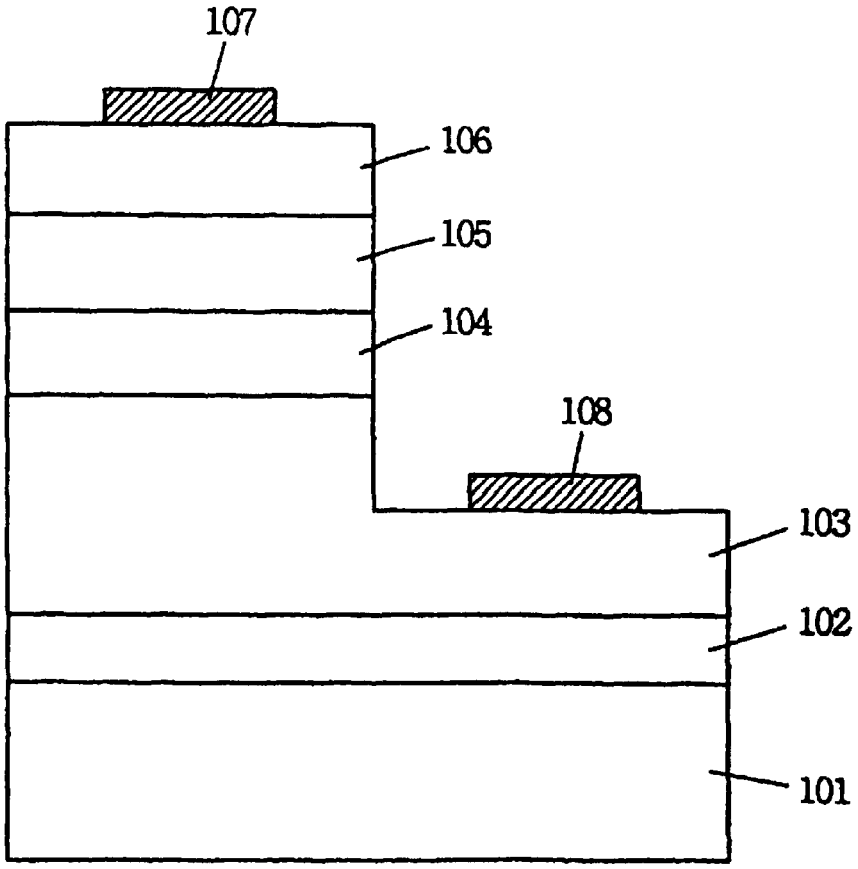
FIG. 8 PRIOR ART
FIG. 8 is a schematic cross-sectional diagram of a conventional light emitting diode.

In the structure of FIG. 7, an InGaN layer 82 is formed on an n-type SiC layer 81 and a p-type SiC layer 84 is formed above the InGaN layer 82 with an undoped GaN cap layer 83 therebetween. In this case, as well, the InGaN layer 82 and the undoped GaN cap layer 83 are formed at a growth temperature of 700–950° C. and the p-type SiC layer 84 is formed at a growth temperature of 1300–1500° C. In this example, as well, formation of the undoped GaN cap layer 83 on the InGaN layer 82 suppresses elimination of constituent elements such as In from the InGaN layer 82.

The light emitting diodes of the first to third embodiments can be applied to light sources for use in optical fiber communication systems, light sources for use in photocouplers, monochromatic or polychromatic pilot lamps, light sources for use in display devices such as digital displays, level meters and displays, light sources for use in facsimile devices, printer heads, signal lamps, lamps for use in automobiles such as high-beam lamps, liquid-crystal televisions, back-light sources for use in liquid-crystal displays, amusement systems, and so on.

The semiconductor laser devices of the fourth to sixth embodiments can be applied to laser surgical knives, light sources for use in optical communication systems, light sources for use in optical pick-up devices in disk systems for DVD (Digital Video Disk) and the like, light sources for use in color laser beam printers, light sources for use in laser processing devices, light sources for laser holographies, light sources for laser displays, light sources for amusement systems, and so on.

While the invention has been described in detail, the foregoing description is in all aspects illustrative and not restrictive. It is understood that numerous other modifications and variations can be devised without departing from the scope of the invention.

What is claimed is:

[1. A method of manufacturing a light emitting device, comprising the steps of:

forming an active layer composed of a nitride system semiconductor by a vapor phase growth method;

forming a cap layer composed of a nitride system semiconductor on said active layer by a vapor phase growth method at a growth temperature approximately equal to or lower than a growth temperature for said active layer; and forming a cladding layer composed of a nitride system semiconductor of one conductivity type on said cap layer by a vapor phase growth method;

wherein said cap layer has a lower impurity concentration than said cladding layer.]

[2. The method of manufacturing a light emitting device according to claim 1, wherein said active layer is composed of a III-V group nitride system semiconductor, said cap layer is composed of a III-V group nitride system semiconductor, and said cladding layer is composed of a III-V group nitride system semiconductor.]

[3. The method of manufacturing a light emitting device according to claim 2, wherein said step of forming a cladding layer includes forming said cladding layer at a growth temperature higher than the temperature allowing crystal growth of said active layer.]

[4. The method of manufacturing a light emitting device according to claim 3, wherein said cap layer is composed of $Al_uGa_{1-u}N$, said cladding layer is composed of $Al_zGa_{1-z}N$ of one conductivity type, and the Al composition ratio u of said cap layer is smaller than the Al composition ratio z of said cladding layer.]

[5. The method of manufacturing a light emitting device according to claim 4, wherein the Al composition ratio u of said cap layer is approximately equal to or smaller than 0.1.]

[6. The method of manufacturing a light emitting device according to claim 1, wherein said cap layer is an undoped layer.]

[7. The method of manufacturing a light emitting device according to claim 1, wherein said cap layer has a thickness of approximately not smaller than 200 Å nor larger than 400 Å.]

[8. The method of manufacturing a light emitting device according to claim 1, wherein the step of forming said cap layer includes forming said cap layer at a growth temperature of not lower than 700° C. nor higher than 950° C.]

[9. The method of manufacturing a light emitting device according to claim 1, wherein said step of forming said cap layer includes forming said cap layer at a growth temperature approximately equal to the growth temperature for said active layer.]

[10. The method of manufacturing a light emitting device according to claim 1, wherein said active layer is composed of InGaN.]

[11. The method of manufacturing a light emitting device according to claim 1, wherein said active layer has a quantum well structure including an InGaN quantum well layer and a GaN quantum barrier layer, and the step of forming said active layer includes forming said GaN quantum barrier layer at a growth temperature of not lower than 700° C. nor higher than 950° C.]

*12. A method of manufacturing a light emitting device, comprising, in the following order, the steps of:*

*forming a buffer layer composed of a nitride based compound semiconductor on a substrate;*

*forming an underlayer composed of a nitride based compound semiconductor;*

*forming a first cladding layer composed of a nitride based compound semiconductor of a first conductivity type;*

*forming an active layer composed of a nitride based compound semiconductor containing indium;*

*forming a cap layer composed of AlGaN;*

*forming a second cladding layer composed of a nitride based compound semiconductor of a second conductivity type at a growth temperature higher than that of said active layer,*

*wherein said step of forming the active layer includes forming a quantum well structure including a quantum well layer and quantum barrier layer.*

*13. The method according to claim 12, further comprising the step of forming a contact layer of the first conductivity type on said underlayer.*

*14. The method according to claim 13, wherein said step of forming the contact layer of the first conductivity type includes forming said contact layer of the first conductivity type at a growth temperature of not lower than 1000° C. nor higher than 1200° C.*

*15. The method according to claim 12, further comprising the step of forming a contact layer of the second conductivity type on said second cladding layer.*

*16. The method according to claim 15, wherein said step of forming the contact layer of the second conductivity type includes forming a contact layer of the second conductivity type composed of GaN.*

*17. The method according to claim 12, wherein said step of forming said quantum well structure includes forming a quantum well layer composed of* $In_sGa_{1-s}N$ *wherein* $1>s>0$.

*18. The method according to claim 12, wherein said step of forming the quantum well structure includes forming a quantum well layer composed of* $In_sGa_{1-s}N$ *wherein* $1>s>0$, *and a quantum barrier layer composed of* $In_rGa_{1-r}N$ *wherein* $1>s>r\geqq 0$.

*19. The method according to claim 12, wherein said step of forming the cap layer includes forming a cap layer having an Al composition ratio of at most 0.1.*

*20. A method of manufacturing a light emitting device, comprising, in the following order, the steps of:*

*forming a buffer layer composed of a nitride based compound semiconductor on a substrate;*

*forming an underlayer composed of a nitride based compound semiconductor;*

*forming a first cladding layer composed of a nitride based compound semiconductor of a first conductivity type;*

*forming an active layer composed of a nitride based compound semiconductor containing indium;*

*forming a cap layer composed of AlGaN;*

*forming a second cladding layer composed of a nitride based compound semiconductor of a second conductivity type at a growth temperature higher than that of said active layer,*

*wherein said step of forming the cap layer includes forming a cap layer having a bandgap between those of said active layer and said second cladding layer.*

*21. A method of manufacturing a light emitting device, comprising, in the following order, the steps of:*

*forming a buffer layer composed of a nitride based compound semiconductor on a substrate;*

*forming an underlayer composed of a nitride based compound semiconductor;*

*forming a first cladding layer composed of a nitride based compound semiconductor of a first conductivity type;*

*forming an active layer composed of a nitride based compound semiconductor containing indium;*

*forming a cap layer composed of AlGaN;*

*forming a second cladding layer composed of a nitride based compound semiconductor of a second conductivity type at a growth temperature higher than that of said active layer,*

*wherein said step of forming the cap layer includes forming a cap layer having an impurity concentration lower than that of said second cladding layer.*

*22. The method according to claim 12, wherein said step of forming the cap layer includes forming an undoped cap layer.*

*23. The method according to claim 12, wherein said step of forming the cap layer includes forming a cap layer having a thickness of not smaller than 200 Å nor larger than 400 Å.*

*24. The method according to claim 12, wherein said step of forming the second cladding layer includes forming a second cladding layer composed of AlGaN.*

*25. The method according to claim 24, wherein said step of forming the cap layer includes forming a cap layer having an Al composition ratio smaller than that of said second cladding layer.*

*26. The method according to claim 12, wherein said step of forming the cap layer includes forming as said cap layer a layer suppressing elimination of the indium from said active layer.*

*27. The method according to claim 12, wherein said step of forming the underlayer includes forming an underlayer composed of* $Al_yGa_{1-y}N$, *and the Al composition ratio y of said underlayer is at least 0 and smaller than 1.*

28. The method according to claim 12, wherein said step of forming the buffer layer includes forming a buffer layer composed of $Al_xGa_{1-x}N$, and the Al composition ratio x of said buffer layer is larger than 0 and at most 1.

29. The method according to claim 28, wherein said step of forming the buffer layer includes forming a buffer layer having an Al composition ratio x of not smaller than 0.4 nor larger than 0.6.

30. The method according to claim 12, wherein said step of forming the active layer includes forming an active layer composed of InGaN.

31. The method according to claim 12, wherein said step of forming the active layer includes forming said active layer at a growth temperature of not lower than 700° C. nor higher than 950° C.

32. The method according to claim 12, wherein said step of forming the second cladding layer includes forming said second cladding layer at a growth temperature of not lower than 1000° C. nor higher than 1200° C.

33. The method according to claim 12, wherein said step of forming the first cladding layer includes forming a first cladding layer composed of AlGaN.

34. The method according to claim 12, wherein said step of forming the cap layer includes forming said cap layer at a growth temperature substantially equal to or lower than that of said active layer.

35. The method according to claim 12, wherein said step of forming the cap layer includes forming said cap layer at a growth temperature of not lower than 700° C. nor higher than 950° C.

36. A method of manufacturing a light emitting device, comprising, in the following order, the steps of:

forming a buffer layer composed of a nitride based compound semiconductor on a substrate;

forming an underlayer composed of a nitride based compound semiconductor;

forming a first cladding layer composed of a nitride based compound semiconductor of a first conductivity type;

forming an active layer composed of a nitride based compound semiconductor containing indium;

forming a cap layer composed of AlGaN;

forming a second cladding layer composed of a nitride based compound semiconductor of a second conductivity type at a growth temperature higher than that of said active layer, wherein said step of forming the underlayer includes forming an undoped underlayer.

37. The method according to claim 12, wherein said step of forming the buffer layer includes forming a non-single crystalline buffer layer.

38. The method according to claim 12, wherein said step of forming the underlayer includes forming a single crystalline underlayer.

39. The method according to claim 12, wherein said step of forming the cap layer includes forming the cap layer containing Al.

40. The method according to claim 12, wherein said step of forming the cap layer includes forming a cap layer having a band gap larger than that of said active layer.

41. A method of manufacturing a light emitting device, comprising, in the following order, the steps of:

forming a buffer layer composed of a nitride based compound semiconductor;

forming an underlayer composed of a nitride based compound semiconductor;

forming a contact layer composed of a first conductivity type;

forming a first cladding layer composed of a nitride based compound semiconductor of the first conductivity type;

forming an active layer having a quantum well structure including a quantum well layer and a quantum barrier layer and composed of a nitride based compound semiconductor containing indium;

forming a cap layer composed of a nitride based compound semiconductor;

forming a second cladding layer composed of a nitride based compound semiconductor of a second conductivity type at a growth temperature higher than that of said active layer.

42. The method according to claim 41, wherein said step of forming the contact layer of the first conductivity type includes forming said contact layer of the first conductivity type at a growth temperature of not lower than 1000° C. nor higher than 1200° C.

43. The method according to claim 41, further comprising the step of forming a contact layer of the second conductivity type on said second cladding layer.

44. The method according to claim 41, wherein said step of forming the contact layer of the second conductivity type includes forming a contact layer of the second conductivity type composed of GaN.

45. The method according to claim 41, wherein said step of forming the active layer includes forming a quantum well layer composed of $In_sGa_{1-s}N$ wherein $1>s>0$.

46. The method according to claim 41, wherein said step of forming the active layer includes forming a quantum well layer composed of $In_sGa_{1-s}N$ wherein $1>s>0$, and a quantum barrier layer composed of $In_rGa_{1-r}N$ wherein $1>s>r\geqq 0$.

47. The method according to claim 41, wherein said step of forming the cap layer includes forming a cap layer having an Al composition ratio of at most 0.1.

48. The method according to claim 41, wherein said step of forming the cap layer includes forming a cap layer having a bandgap between those of said active layer and said second cladding layer.

49. The method according to claim 41, wherein said step of forming the cap layer includes forming a cap layer having an impurity concentration lower than that of said second cladding layer.

50. The method according to claim 41, wherein said step of forming the cap layer includes forming an undoped cap layer.

51. The method according to claim 41, wherein said step of forming the cap layer includes forming a cap layer having a thickness of not smaller than 200 Å nor larger than 400 Å.

52. The method according to claim 41, wherein said step of forming the second cladding layer includes forming a second cladding layer composed of AlGaN.

53. The method according to claim 52, wherein said step of forming the cap layer includes forming a cap layer having an Al composition ratio smaller than that of said second cladding layer.

54. The method according to claim 41, wherein said step of forming the cap layer includes forming as said cap layer a layer suppressing elimination of the indium from said active layer.

55. The method according to claim 41, wherein said step of forming the underlayer includes forming an underlayer composed of $Al_yGa_{1-y}N$, and the Al composition ratio y of said underlayer is at least 0 and smaller than 1.

56. The method according to claim 41, wherein said step of forming the buffer layer includes forming a buffer layer composed of $Al_xGa_{1-x}N$, and the Al composition ratio x of said buffer layer is larger than 0 and at most 1.

57. The method according to claim 108, wherein said step of forming the buffer layer includes forming a buffer layer having an Al composition ratio x of not smaller than 0.4 nor larger than 0.6.

58. The method according to claim 41, wherein said step of forming the active layer includes forming an active layer composed of InGaN.

59. The method according to claim 41, wherein said step of forming the active layer includes forming said active layer at a growth temperature of not lower than 700° C. nor higher than 950° C.

60. The method according to claim 41, wherein said step of forming the second cladding layer includes forming said second cladding layer at a growth temperature of not lower than 1000° C. nor higher than 1200° C.

61. The method according to claim 41, wherein said step of forming the first cladding layer includes forming a first cladding layer composed of AlGaN.

62. The method according to claim 41, wherein said step of forming the cap layer includes forming said cap layer at a growth temperature substantially equal to or lower than that of said active layer.

63. The method according to claim 41, wherein said step of forming the cap layer includes forming said cap layer at a growth temperature not lower than 700° C. nor higher than 950° C.

64. The method according to claim 41, wherein said step of forming the underlayer includes forming an undoped underlayer.

65. The method according to claim 41, wherein said step of forming the buffer layer includes forming a non-single crystalline buffer layer.

66. The method according to claim 41, wherein said step of forming the underlayer includes forming a single crystalline underlayer.

67. The method according to claim 41, wherein said step of forming the cap layer includes forming a cap layer composed of AlGaN.

68. The method according to claim 67, wherein said step of forming the cap layer includes forming the cap layer containing Al.

69. The method according to claim 41, wherein said step of forming the cap layer includes forming a cap layer having a band gap larger than that of said active layer.

70. A method of manufacturing a light emitting device, comprising, in the following order, the steps of:

forming a buffer layer composed of a nitride based compound semiconductor on a substrate;

forming an underlayer composed of a nitride based compound semiconductor;

forming a contact layer composed of a first conductivity type;

forming a first cladding layer composed of a nitride based compound semiconductor of the first conductivity type;

forming an active layer having a quantum well structure including a quantum well layer and a quantum barrier layer and composed of a nitride based compound semiconductor containing indium; and forming a second cladding layer composed of a nitride based compound semiconductor of a second conductivity type at a growth temperature higher than that of said active layer.

71. The method according to claim 70, wherein said step of forming the contact layer of the first conductivity type includes forming said contact layer of the first conductivity type at a growth temperature of not lower than 1000° C. nor higher than 1200° C.

72. The method according to claim 70, further comprising the step of forming a contact layer of the second conductivity type on said second cladding layer.

73. The method according to claim 70, wherein said step of forming the contact layer of the second conductivity type includes forming a contact layer of the second conductivity type composed of GaN.

74. The method according to claim 70, wherein said step of forming the active layer includes forming a quantum well layer composed of $In_sGa_{1-s}N$ wherein $1>s>0$.

75. The method according to claim 70, wherein said step of forming the active layer includes forming a quantum well layer composed of $In_sGa_{1-s}N$ wherein $1>s>0$, and a quantum barrier layer composed of $In_rGa_{1-r}N$ wherein $1>s>r\geqq 0$.

76. The method according to claim 70, wherein said step of forming the second cladding layer includes forming a second cladding layer composed of AlGaN.

77. The method according to claim 70, wherein said step of forming the underlayer includes forming an underlayer composed of $Al_yGa_{1-y}N$, and the Al composition ratio y of said underlayer is at least 0 and smaller than 1.

78. The method according to claim 70, wherein said step of forming the buffer layer includes forming a buffer layer composed of $Al_xGa_{1-x}N$, and the Al composition ratio x of said buffer layer is larger than 0 and at most 1.

79. The method according to claim 70, wherein said step of forming the buffer layer includes forming a buffer layer having an Al composition ratio x of not smaller than 0.4 nor larger than 0.6.

80. The method according to claim 70, wherein said step of forming the active layer includes forming an active layer composed of InGaN.

81. The method according to claim 70, wherein said step of forming the active layer includes forming said active layer at a growth temperature of not lower than 700° C. nor higher than 950° C.

82. The method according to claim 70, wherein said step of forming the second cladding layer includes forming said second cladding layer at a growth temperature of not lower than 1000° C. nor higher than 1200° C.

83. The method according to claim 70, wherein said step of forming the first cladding layer includes forming a first cladding layer composed of AlGaN.

84. The method according to claim 70, wherein said step of forming the underlayer includes forming an undoped underlayer.

85. The method according to claim 70, wherein said step of forming the buffer layer includes forming a non-single crystalline buffer layer.

86. The method according to claim 70, wherein said step of forming the underlayer includes forming a single crystalline underlayer.

* * * * *